United States Patent
Xu et al.

(10) Patent No.: US 12,004,375 B2
(45) Date of Patent: Jun. 4, 2024

(54) PIXEL DEFINING LAYER, ORGANIC LIGHT-EMITTING DIODE DISPLAY PANEL, AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Biao Xu, Beijing (CN); Hungchieh Hu, Beijing (CN); Heng Yang, Beijing (CN)

(73) Assignees: CHENGDU BOE OPTOELECTRONICS TECHNOLOGY CO., LTD, Sichuan (CN); BOE TECHNOLOGY GROUP CO., LTD, Beijing (CN)

( * ) Notice: Subject to any disclaimer, the term of this patent is extended or adjusted under 35 U.S.C. 154(b) by 567 days.

(21) Appl. No.: 17/280,298

(22) PCT Filed: Jun. 5, 2020

(86) PCT No.: PCT/CN2020/094691
§ 371 (c)(1),
(2) Date: Mar. 26, 2021

(87) PCT Pub. No.: WO2020/248912
PCT Pub. Date: Dec. 17, 2020

(65) Prior Publication Data
US 2022/0037432 A1    Feb. 3, 2022

(30) Foreign Application Priority Data
Jun. 14, 2019 (CN) .......................... 201910514646.4

(51) Int. Cl.
*H01L 27/02* (2006.01)
*H01L 51/52* (2006.01)
(Continued)

(52) U.S. Cl.
CPC ......... *H10K 59/122* (2023.02); *H10K 50/856* (2023.02); *H10K 71/00* (2023.02);
(Continued)

(58) Field of Classification Search
None
See application file for complete search history.

(56) References Cited

U.S. PATENT DOCUMENTS

2015/0097175 A1   4/2015   Liu et al.
2015/0188093 A1   7/2015   Kim et al.
(Continued)

FOREIGN PATENT DOCUMENTS

CN   104979375 A   10/2015
CN   106910762 A   6/2017
(Continued)

OTHER PUBLICATIONS

First office action of Chinese application No. 201910514646.4 dated Dec. 3, 2020.
(Continued)

*Primary Examiner* — Asok K Sarkar
(74) *Attorney, Agent, or Firm* — Lippes Mathias LLP

(57) ABSTRACT

Provided is a pixel defining layer of an organic light-emitting diode display panel. The pixel defining layer includes: an insulating transparent cladding layer; and a reflecting layer in the transparent cladding layer, wherein the reflecting layer is configured to reflect light emitted from a light-emitting layer of the organic light-emitting diode display panel. Organic light-emitting diode display panels and
(Continued)

methods for manufacturing an organic light-emitting diode display panel are also provided.

18 Claims, 5 Drawing Sheets

(51) Int. Cl.
| | |
|---|---|
| *H10K 50/856* | (2023.01) |
| *H10K 59/122* | (2023.01) |
| *H10K 71/00* | (2023.01) |
| *H10K 50/818* | (2023.01) |
| *H10K 50/828* | (2023.01) |
| *H10K 59/12* | (2023.01) |
| *H10K 102/00* | (2023.01) |

(52) U.S. Cl.
CPC ......... *H10K 50/818* (2023.02); *H10K 50/828* (2023.02); *H10K 59/1201* (2023.02); *H10K 2102/3026* (2023.02)

(56) References Cited

U.S. PATENT DOCUMENTS

| | | |
|---|---|---|
| 2017/0194602 A1 | 7/2017 | Cui et al. |
| 2019/0067394 A1* | 2/2019 | Cheon ................. G09G 3/3225 |
| 2019/0312234 A1 | 10/2019 | Liu |
| 2021/0233980 A1 | 7/2021 | Lv et al. |

FOREIGN PATENT DOCUMENTS

| | | |
|---|---|---|
| CN | 108538888 A | 9/2018 |
| CN | 207868202 U | 9/2018 |
| CN | 109873023 A | 6/2019 |
| CN | 110212004 A | 9/2019 |

OTHER PUBLICATIONS

Second office action of Chinese application No. 201910514646.4 dated Jun. 11, 2021.

* cited by examiner

PIXEL DEFINING LAYER, ORGANIC LIGHT-EMITTING DIODE DISPLAY PANEL, AND MANUFACTURING METHOD THEREOF

CROSS-REFERENCE TO RELATED APPLICATIONS

This application is a 371 of PCT Application No. PCT/CN2020/094691, filed on Jun. 5, 2020, which claims priority to Chinese Patent Application No. 201910514646.4, filed on Jun. 14, 2019 and entitled "PIXEL DEFINING LAYER, ORGANIC LIGHT-EMITTING DIODE DISPLAY PANEL, AND MANUFACTURING METHOD THEREOF," the entire contents of which are incorporated herein by reference.

TECHNICAL FIELD

The present disclosure relates to a pixel defining layer of an organic light-emitting diode display panel, an organic light-emitting diode display panel, and a manufacturing method thereof.

BACKGROUND

Organic light-emitting diode (OLED) display devices have the advantages of active light emission, good temperature characteristics, low power consumption, high response speed, flexibility, ultrathin, and low cost, and hence have been widely used in display devices. However, studies have shown that the actual output efficiency of light emitted into the air by the organic light-emitting diode is only about 20%, and 80% of light beams are restricted or consumed inside the device. Therefore, a key technology to improve the efficiency of the organic light-emitting diode device and prolong the service life of the organic light-emitting diode device is how to reduce the light consumption inside the organic light-emitting diode.

SUMMARY

At least one embodiment of the present disclosure provides a pixel defining layer of an organic light-emitting diode display panel. The pixel defining layer includes:
  an insulating transparent cladding layer; and
  a reflecting layer in the transparent cladding layer, wherein the reflecting layer is configured to reflect light emitted from a light-emitting layer of the organic light-emitting diode display panel.

Optionally, a thickness of the reflecting layer is not less than a thickness of the light-emitting layer in a direction perpendicular to a substrate of the organic light-emitting diode display panel.

Optionally, the thickness of the reflecting layer ranges from 0.5 μm to 1.4 μm, and the thickness of the light-emitting layer is 0.4 μm.

Optionally, a side of the reflecting layer proximal to the light-emitting layer surrounded by the reflecting layer is inclined, and an area of a side of the reflecting layer distal from the substrate of the organic light-emitting diode display panel is less than an area of a side of the reflecting layer proximal to the substrate.

Optionally, an angle between the inclined side surface of the reflecting layer and the substrate of the organic light-emitting diode display panel is greater than or equal to 15° and less than or equal to 30°.

Optionally, a reflectivity of the reflecting layer is greater than 90%.

Optionally, the reflecting layer is a metal layer.

Optionally, a material of the metal layer is Ag or Al.

Optionally, the transparent cladding layer is provided with a plurality of grooves, wherein a side of the groove proximal to the light-emitting layer surrounded by the groove is inclined, and an area of a side of the groove distal from the substrate of the organic light-emitting diode display panel is greater than an area of a side of the groove proximal to the substrate.

Optionally, an angle between a side of the groove and the substrate is greater than or equal to 25° and less than or equal to 30°.

Optionally, a transparency of the transparent cladding layer is greater than 90%.

At least one embodiment of the present disclosure provides an organic light-emitting diode display panel. The organic light-emitting diode display pane includes:
  a substrate;
  the pixel defining layer as described above; and
  a device layer in a groove defined by the pixel defining layer.

Optionally, the device layer includes:
  a reflecting electrode;
  a light-emitting layer on the reflecting electrode; and
  a transparent electrode on the light-emitting layer.

Optionally, a material of the reflecting electrode is Ag or an ITO-Ag-ITO alloy; and
  a material of the transparent electrode is one of Ag, Al, a Mg—Ag alloy, and a Mg—Al alloy.

At least one embodiment of the present disclosure provides a method for manufacturing the organic light-emitting diode display panel as described above. The method includes:
  forming a pixel defining layer on the substrate; and
  forming a device layer in a groove defined by the pixel defining layer.

Optionally, forming the device layer in the groove defined by the pixel defining layer includes:
  forming, before the pixel defining layer is manufactured, a first metal layer on the substrate;
  forming the reflecting electrode by patterning the first metal layer; and
  forming the device layer by forming the light-emitting layer and the transparent electrode sequentially on the reflecting electrode.

Optionally, forming the pixel defining layer on the substrate includes:
  forming a second metal layer to cover the reflecting electrode and the substrate;
  forming the reflecting layer by patterning the second metal layer, wherein the reflecting layer surrounds the exposed reflecting electrode and is electrically isolated from the reflecting electrode;
  forming a polyimide layer to cover the reflecting layer and the reflecting electrode; and
  forming the transparent cladding layer by patterning the polyimide layer, wherein the pixel defining layer is formed by the transparent cladding layer and the reflecting layer, and the pixel defining layer covers the reflecting electrode and surrounds the exposed reflecting electrode.

Optionally, after forming the reflecting electrode by patterning the first metal layer and before forming the second metal layer to cover the reflecting electrode and the substrate, the method further includes: forming an inorganic thin film layer to cover the reflecting electrode and the exposed substrate.

Optionally, forming the second metal layer to cover the reflecting electrode and the substrate and forming the reflecting layer by patterning the second metal layer include:

forming a second metal layer to cover the inorganic thin film layer; and exposing the reflecting electrode by patterning the second metal layer, and forming the reflecting layer on the non-patterned inorganic thin film layer.

DETAILED DESCRIPTION

For clearer description of the present disclosure, the present disclosure is described optionally below in combination with the embodiments and the accompanying drawings. Similar components in the accompanying drawings are represented by the same reference signs. A person skilled in the art should understand that the contents described below are intended to be illustrative and not restrictive, and are not intended to limit the scope of protection of the present disclosure.

Figure 1:
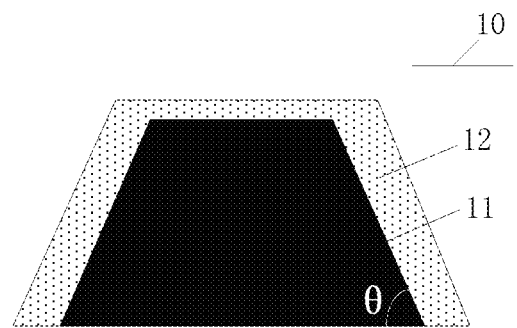
FIG. 1 shows a structural diagram of a pixel defining layer according to an embodiment of the present disclosure.

As shown in FIG. 1, an embodiment of the present disclosure provides a pixel defining layer of an organic light-emitting diode display panel. The pixel defining layer includes a transparent cladding layer and a reflecting layer, wherein the transparent cladding layer is insulating. The reflecting layer is in the transparent cladding layer and configured to reflect light emitted from a light-emitting layer of the organic light-emitting diode display panel.

Figure 2:
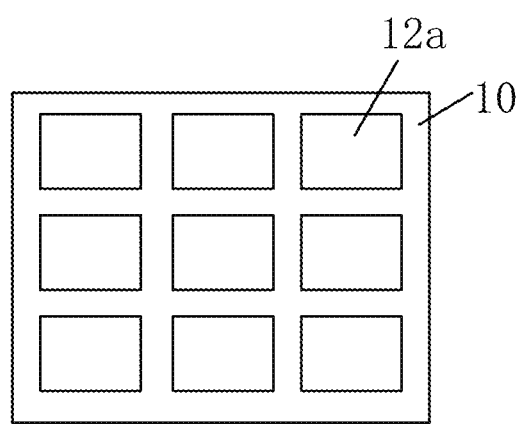
FIG. 2 is a top view of a pixel defining layer according to an embodiment of the present disclosure.

FIG. 2 is a top view of a pixel defining layer according to an embodiment of the present disclosure. Referring to FIG. 2, the pixel defining layer 10 is configured to define a plurality of grooves 12a, each groove 12a corresponds to a sub-pixel, and a light-emitting layer of each sub-pixel is in the corresponding groove 12a. Hence, both the transparent cladding layer and the reflecting layer in the pixel defining layer are disposed around the light-emitting layer.

In the embodiment of the present disclosure, the pixel defining layer of the organic light-emitting diode display panel is manufactured and the lateral light emitted from an organic light-emitting diode device is reflected by a metal layer disposed in the pixel defining layer, such that the waveguide effect of the organic light-emitting diode device can be reduced and the light output efficiency of the organic light-emitting diode device is increased. Therefore, the problem in the prior art is solved and the light emission performance of the organic light-emitting diode device is enhanced.

Exemplarily, the reflecting layer is a metal layer, and the metal layer has a good reflection effect, thereby ensuring sufficient reflection of the light emitted from the light-emitting layer.

In addition, as the metal layer is conductive, for avoiding short circuit of electrodes (such as an anode) of different sub-pixels due to the pixel defining layer, an insulating transparent cladding layer outside the reflecting layer is disposed to achieve insulation between the metal layer and the electrodes of the sub-pixels.

The following description is given by taking the metal layer as an example. In other embodiments, the reflecting layer may also be made of other materials, which is not limited in the present disclosure.

In one example, as shown in FIG. 1, the pixel defining layer 10 is applied to an organic light-emitting diode display panel and includes a reflecting layer 11 and a transparent cladding layer 12. The reflecting layer 11 is covered by the transparent cladding layer 12 and configured to reflect lateral light emitted from a device layer of the organic light-emitting diode display panel defined by the pixel defining layer. Thus, the light output efficiency of the organic light-emitting diode display panel is increased. In addition, as the reflecting layer 11 is covered by the transparent cladding layer 12, the electrical isolation between the reflecting layer 11 and the device layer of the organic light-emitting diode display panel can be achieved. That is, the reflecting layer 11 is insulated from the device layer of the organic light-emitting diode display panel. Thus, transverse currents can be effectively prevented from being generated in the organic light-emitting diode display panel.

Figure 4:
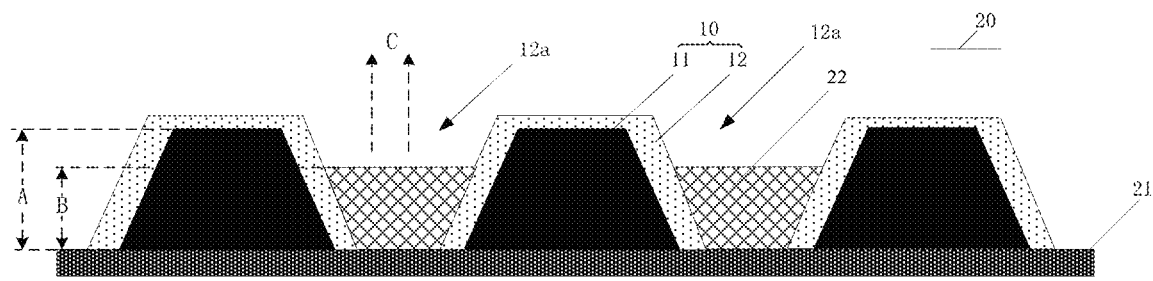
FIG. 4 shows a structural diagram of an organic light-emitting diode display panel according to an embodiment of the present disclosure.

Considering that the light-emitting layer of the organic light-emitting diode display panel has certain thickness and emits the lateral light towards the pixel defining layer, in one optional embodiment, referring to FIG. 4, a thickness A of the reflecting layer 11 is not less than a thickness of the light-emitting layer (part of sign 22 in FIG. 4) in a light emission direction C of the organic light-emitting diode display panel. That is, the reflecting layer can receive all the lateral light emitted from the organic light-emitting layer and completely reflect the lateral light, thereby maximizing the light output efficiency of the organic light-emitting diode device.

Exemplarily, the thickness A of the reflecting layer 11 ranges from 0.5 μm to 1.4 μm, a thickness B of the device layer 22 is about 0.4 μm, and the thickness of the light-emitting layer is less than 0.4 μm.

Figure 3A:
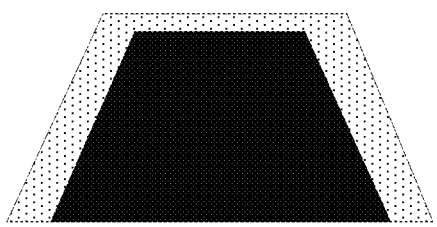
FIGS. 3a-3d show longitudinal sectional views of a reflecting layer according to an embodiment of the present disclosure.
Figure 3B:
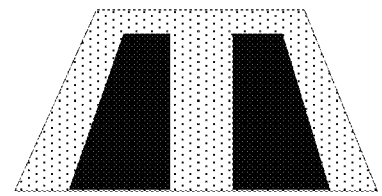
Figure 3C:
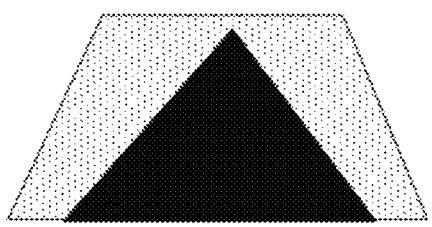
Figure 3D:
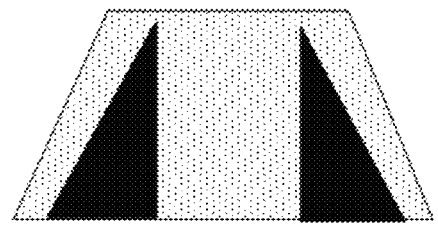

In one optional embodiment, as shown in FIG. 1 and FIG. 4, a side of the reflecting layer 11 proximal to the light-emitting layer surrounded by the reflecting layer is inclined, and an area of a side of the reflecting layer 11 distal from the substrate of the organic light-emitting diode display panel is less than an area of a side of the reflecting layer 11 proximal to the substrate. That is, a width of the reflecting layer 11 decreases along the light emission direction C of the organic light-emitting diode display panel. That is, an angle is formed between the reflecting layer and the substrate. For further increasing the light output efficiency of the organic light-emitting diode display panel, the reflecting layer is shaped to reflect the lateral light of the organic light-emitting diode display panel towards the light emission direction of the organic light-emitting diode display panel, which is manifested as a decrease in the width of the reflecting layer along the light emission direction of the organic light-emitting diode display panel. As shown in FIGS. 3a-3d, the shape of the reflecting layer includes, but is not limited to a trapezoid or a triangle, and also includes other shapes which can reflect the lateral light. In the case that the shape of the reflecting layer is of a separate structure as shown in FIGS. 3b and 3d, the width of the reflecting layer is an overall width of the separate structure. A person skilled in the art should understand that the shape of the reflecting layer is set according to actual application demands, which is not repeated herein.

In one optional embodiment, as shown in FIG. 1, the angle θ between the inclined side surface of the reflecting layer and the substrate of the organic light-emitting diode display panel is greater than or equal to 15° and less than or equal to 30°. That is, as the angle θ between the reflecting layer and the substrate is in the range of [15°, 30°], the light output efficiency of the organic light-emitting diode display panel can be increased to the greatest extent.

In another optional embodiment, a reflectivity of the reflecting layer is greater than 90%. That is, the higher the reflectivity of the reflecting layer is, the high the reflection efficiency is. In this embodiment, the reflecting layer is made of metal Ag or Al having a high reflectivity, and thus the light output efficiency of the organic light-emitting diode display panel can be effectively increased.

In one optional embodiment, as shown in FIG. 4, the transparent cladding layer 12 is provided with a plurality of grooves 12a. A side surface of the groove 12a proximal to the light-emitting layer surrounded by the groove 12a is inclined, and an area of a side of the groove 12a distal from the substrate of the organic light-emitting diode display panel is greater than an area of a side of the groove 12a proximal to the substrate. The groove gradually increases along the direction C.

Exemplarily, the groove is a through groove.

Exemplarily, an angle between a side of the groove and the substrate is greater than or equal to 25° and less than or equal to 30°. That is, the angle θ between the side of the groove and the substrate is in the range of [15°, 30°].

Exemplarily, a transparency of the transparent cladding layer 12 is greater than 90%. In this embodiment, the transparent cladding layer 12 is made of polyimide having a high transmittance, and thus the transparency of the transparent cladding layer 12 can be ensured.

On the basis of the above pixel defining layer, as shown in FIG. 4, an embodiment of the present disclosure further provides an organic light-emitting diode display panel 20. The organic light-emitting diode display panel includes a substrate 21 integrated with a thin film transistor, the pixel defining layer 10 according to the above embodiment, and a device layer 22 of the organic light-emitting diode display panel defined by the pixel defining layer 10. In this embodiment, the lateral light emitted from the organic light-emitting diode device layer is reflected by the reflecting layer disposed in the pixel defining layer, such that the light output efficiency of the organic light-emitting diode device can be increased, and thus the light emission performance of the organic light-emitting diode device is enhanced.

Figure 5:
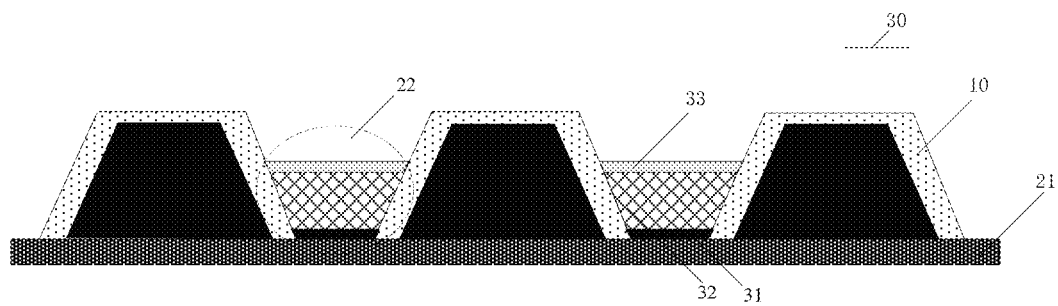
FIG. 5 shows a structural diagram of an organic light-emitting diode display panel according to another embodiment of the present disclosure.

Considering that the light emitted from the light-emitting layer of the organic light-emitting diode device diverges towards various directions, in one optional embodiment, as shown in FIG. 5, the device layer of the organic light-emitting diode display panel 30 includes: a reflecting electrode 31, a light-emitting layer 32 formed on the reflecting electrode 31, and a transparent electrode 33 formed on the light-emitting layer 32. That is, the electrode 31, proximal to the substrate, in the organic light-emitting diode device layer 22 is disposed as metal, which can reflect the received light of the organic light-emitting diode device layer to the light emission direction of the organic light-emitting diode display panel. The reflecting electrode and the reflecting layer form a cup-shaped structure for reflecting the light emitted from the light-emitting layer, thereby further increasing the light output efficiency of the organic light-emitting diode display panel. In other words, the reflecting electrode and the reflecting layer jointly reflect the light confined in the organic light-emitting diode device, such that the waveguide effect of the organic light-emitting diode device is reduced, and the light output efficiency of the organic light-emitting diode device is increased. In addition, the color mixing between adjacent pixels can be prevented, and thus the light emission performance of the organic light-emitting diode device is effectively enhanced. In this embodiment, the reflecting electrode is an anode. It should be noted that the reflecting electrode may be either an anode or a cathode, which is not limited in the present disclosure. A person skilled in the art should dispose the reflecting electrode according to a practical application scenario, so as to satisfy actual demands as design criteria.

Exemplarily, a material of the reflecting electrode 31 of the organic light-emitting diode display panel is Ag or ITO-Ag-ITO, and a material of the transparent electrode 33 of the organic light-emitting diode display panel is one of Ag, Al, a Mg—Ag alloy, and a Mg—Al alloy.

Exemplarily, the reflecting electrode 31 is an anode, and the transparent electrode 33 is a cathode.

Exemplarily, the light-emitting layer 32 may include, but is not limited to a hole injection sub-layer, a hole transport sub-layer, an electron barrier sub-layer, an RGB light-emitting sub-layer (or called an organic light-emitting sub-layer), a hole barrier sub-layer, an electron transport sub-layer, an electron injection sub-layer and the like which are sequentially stacked. The material of each sub-layer in the light-emitting layer 32 is an organic evaporation material or an inkjet printing material, and an organic thin film is formed by an evaporation process or an inkjet printing process. In the embodiment of the present disclosure, a film thickness of the device layer is generally about 400 nm.

Corresponding to the organic light-emitting diode display panel according to the above embodiment, an embodiment of the present disclosure further provides a method for manufacturing the above organic light-emitting diode display panel. As the manufacturing method according to this embodiment corresponds to the organic light-emitting diode display panel according to the above several embodiments, the above implementation is also applicable to the manufacturing method according to this embodiment and is not described in detail again in this embodiment.

Figure 6:
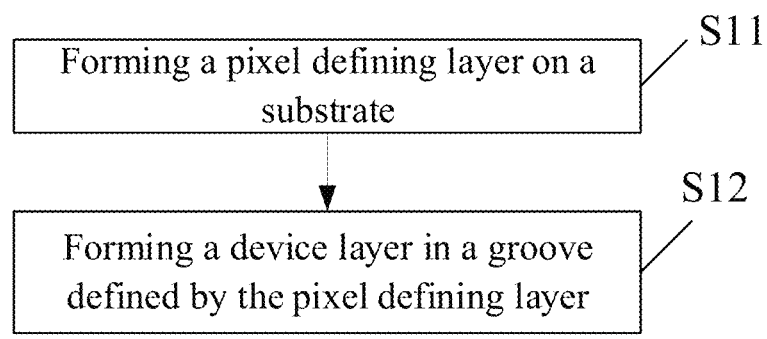
FIG. 6 shows a flowchart of a method for manufacturing an organic light-emitting diode display panel according to an embodiment of the present disclosure.

As shown in FIG. 6, an embodiment of the present disclosure further provides a method for manufacturing the organic light-emitting diode display panel above. The method includes the following steps.

In step S11, a pixel defining layer is formed on the substrate.

In step S12, a device layer is formed in a groove defined by the pixel defining layer.

The step S12 may include: forming, before the pixel defining layer is manufactured, a first metal layer on the substrate; forming the reflecting electrode by patterning the first metal layer; and forming the device layer by forming the light-emitting layer and the transparent electrode sequentially on the reflecting electrode.

The step S11 may include: forming a second metal layer to cover the reflecting electrode and the substrate; forming the reflecting layer by patterning the second metal layer, wherein the reflecting layer surrounds the exposed reflecting electrode and is electrically isolated from the reflecting electrode; forming a polyimide layer to cover the reflecting layer and the reflecting electrode; and forming the transparent cladding layer by patterning the polyimide layer, wherein the pixel defining layer is formed by the transparent cladding layer and the reflecting layer, and the pixel defining layer covers the reflecting electrode and surrounds the exposed reflecting electrode.

Optionally, after forming the reflecting electrode by patterning the first metal layer and before forming the second metal layer to cover the reflecting electrode and the substrate, the method further includes:

forming an inorganic thin film layer to cover the reflecting electrode and the exposed substrate.

Optionally, forming the second metal layer to cover the reflecting electrode and the substrate and forming the reflecting layer by patterning the second metal layer include:

forming the second metal layer to cover the inorganic thin film layer; and exposing the reflecting electrode by patterning the second metal layer, and forming the reflecting layer on the non-patterned inorganic thin film layer.

Figure 7:
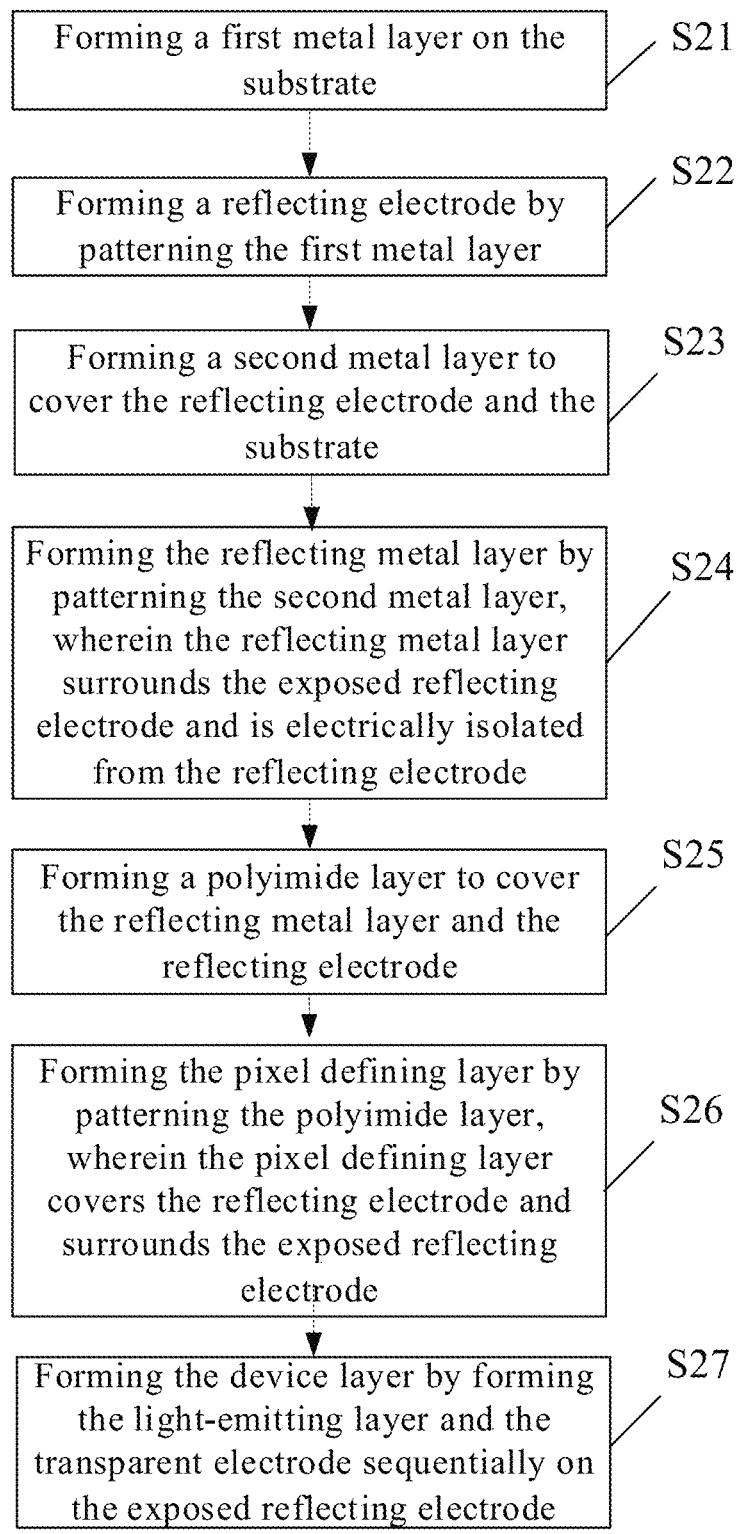
FIG. 7 shows a flowchart of a method for manufacturing an organic light-emitting diode display panel according to an embodiment of the present disclosure.

As shown in FIG. 7, an embodiment of the present disclosure further provides a method for manufacturing the organic light-emitting diode display panel above. The method includes the following steps.

In step S21, a first metal layer is formed on the substrate.

In step S22, the reflecting electrode is formed by patterning the first metal layer.

In step S23, a second metal layer is formed to cover the reflecting electrode and the substrate.

In step S24, the reflecting layer is formed by patterning the second metal layer, wherein the reflecting layer surrounds the exposed reflecting electrode and is electrically isolated from the reflecting electrode.

In step S25, a polyimide layer is formed to cover the reflecting layer and the reflecting electrode.

In step S26, the pixel defining layer is formed by patterning the polyimide layer, wherein the pixel defining layer covers the reflecting electrode and surrounds the exposed reflecting electrode.

In step S27, the device layer is formed by forming the light-emitting layer and the transparent electrode sequentially on the exposed reflecting electrode.

In one example, as shown in FIGS. 8a-8g, the steps are as follows.

Figure 8A:
FIGS. 8a-8g show sectional views corresponding to various stages of a flow for manufacturing an organic light-emitting diode display panel according to an embodiment of the present disclosure.

As shown in FIG. 8a, a first metal layer 310 is formed on the substrate 21.

Exemplarily, the first metal layer is an Ag layer or an ITO-Ag-ITO layer.

In this embodiment, the first metal layer covering the substrate 21 is sputtered on the substrate 21 integrated with a thin film transistor (TFT) array structure.

The structure of the substrate 21 may include: a base substrate, and a gate layer (a gate and a gate line), a gate insulation layer, an active layer, a source-drain layer (a source, a drain and a data line), and a passivation layer which are sequentially stacked on the base substrate. In this embodiment, the base substrate may be a glass substrate; the gate insulation layer and the passivation layer may be silicon nitride or silicon oxynitride layers; the gate layer and the source-drain layer may be metal (such as Al, Cu, Mo, Cr, Ti, or the like) electrode layers, or alloy electrode layers; and the active layer may be made of amorphous silicon, microcrystalline silicon, or polycrystalline silicon. The structure of the above substrate 21 is described by taking a bottom-gate type TFT structure as an example. The substrate structure according to the embodiment of the present disclosure is suitable for a top-gate type TFT and a double-gate TFT in addition to the bottom-gate type TFT.

Figure 8B:

As shown in FIG. 8b, the reflecting electrode 31 is formed by patterning the first metal layer 310.

In this embodiment, the reflecting electrode 31 is formed by etching the first metal layer 310 by an etching process. The reflecting electrode is an anode made of Ag or ITO-Ag-ITO.

Figure 8C:
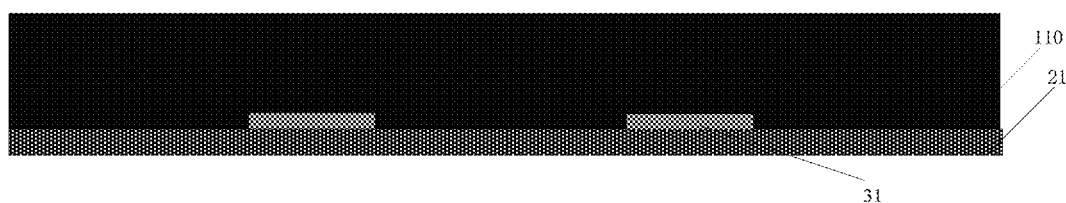

As shown in FIG. 8c, a second metal layer 110 is formed to cover the reflecting electrode 31 and the substrate 21.

In this embodiment, the second metal (Ag or Al) layer having a high reflectivity is sputtered on the reflecting electrode 31 and the substrate 21.

Figure 8D:
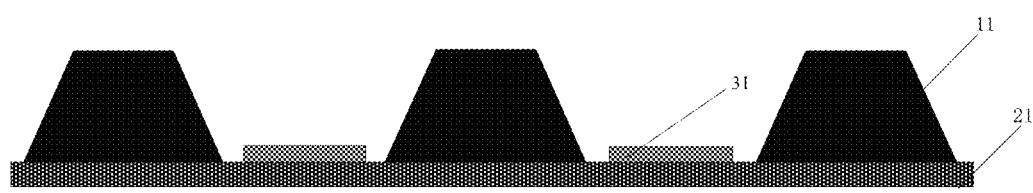

As shown in FIG. 8d, the reflecting layer 11 is formed by patterning the second metal layer 110, wherein the reflecting layer 11 surrounds the exposed reflecting electrode 31 and is electrically isolated from the reflecting electrode 31.

In this embodiment, etching Ag or Al by selecting different etching materials and setting different etching times to form the reflecting layer 11 with a trapezoidal longitudinal section and expose the reflecting electrode 31. A thickness of the reflecting layer 11 is about 0.5 μm to 1.4 μm, which is greater than a film thickness of the organic light-emitting diode device layer. An inclination angle of the reflecting layer 11 ranges from 15° to 30°, and a reflectivity the reflecting layer 11 is greater than 90%. The reflecting layer is electrically isolated from the reflecting electrode, so as to prevent transverse currents from being generated in the organic light-emitting diode device.

Figure 8E:
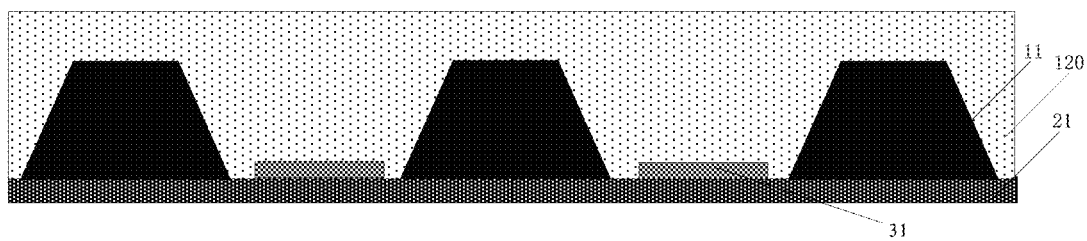

As shown in FIG. 8e, a polyimide layer 120 is formed to cover the reflecting layer 11 and the reflecting electrode 31.

In this embodiment, as shown in FIG. 8e, a layer of polyimide (PI) adhesive is further applied based on the above to cover the reflecting layer and the reflecting electrode.

Figure 8F:
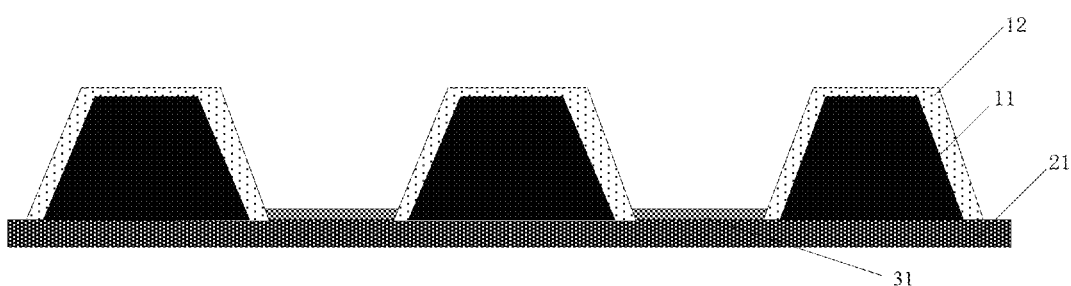

As shown in FIG. 8f, a transparent cladding layer 12 is formed by patterning the polyimide layer 120. The pixel defining layer is formed by the transparent cladding layer 12 and the reflecting layer 11, and the pixel defining layer covers the reflecting electrode and surrounds the exposed reflecting electrode.

In this embodiment, the transparent cladding layer 12 is formed by an exposure and development process. A transparency of the transparent cladding layer 12 is greater than 90% and covers the reflecting layer 11 to form the pixel defining layer. A thickness of the pixel defining layer is about 1.5 μm, and an inclination angle of the pixel defining layer ranges from 25° to 30°. The pixel defining layer surrounds the exposed reflecting electrode 31, and the reflecting layer 11 is insulated from the reflecting electrode 31.

Figure 8G:
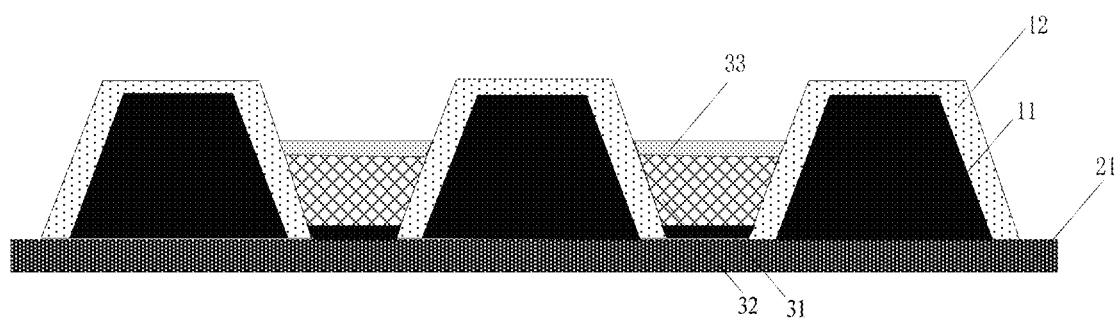

As shown in FIG. 8g, the device layer is formed by forming the light-emitting layer 32 and the transparent electrode 33 sequentially on the exposed reflecting electrode 31.

In this embodiment, the light-emitting layer 32 and the transparent electrode 33 are sequentially formed on the reflecting electrode 31 by an evaporation process or an inkjet printing process. A thickness of the device layer of the organic light-emitting diode display panel is about 0.4 μm, which is less than the thickness of the reflecting layer, ensuring that the light emitted from the light-emitting layer of the organic light-emitting diode display panel can be completely reflected by the reflecting layer. The transparent electrode is a cathode made of one of Ag, Al, a Mg—Ag alloy and a Mg—Al alloy. It should be noted that the organic light-emitting diode device layer further includes a hole injection layer, a hole transport layer, an electronic barrier layer, a hole barrier layer, an electron transport layer, an electron injection layer and the like, which is not limited in the present disclosure. A person skilled in the art should set the device layer according to actual demands, which is not described herein.

To further reduce the complexity of the manufacturing process, in one optional embodiment, after forming the reflecting electrode by patterning the first metal layer and before forming the second metal layer to cover the reflecting electrode and the substrate, the method further includes: forming an inorganic thin film layer to cover the reflecting electrode and the exposed substrate.

Figure 9:
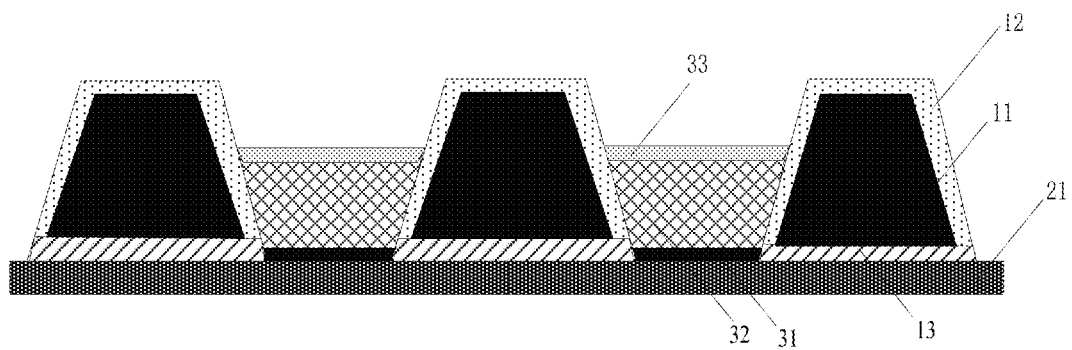
FIG. 9 shows a structural diagram of an organic light-emitting diode display panel according to still another embodiment of the present disclosure.

In this embodiment, after forming the reflecting electrode by patterning the first metal layer and before forming the second metal layer to cover the reflecting electrode and the substrate, the inorganic thin film layer having a thickness of 20 nm is deposited on the reflecting electrode 31 and the substrate 21 to prevent Ag or Al forming the reflecting layer from being mixed with the reflecting electrode in contact therewith. An insulation layer of the reflecting layer and the reflecting electrode is formed by the inorganic thin film layer. Based on this, the manufacturing method further includes: forming the second metal layer to cover the inorganic thin film layer; exposing the reflecting electrode by patterning the second metal layer, and forming the reflecting layer on the non-patterned inorganic thin film layer. FIG. 9 shows the organic light-emitting diode display panel formed in this embodiment. The pixel defining layer further includes an insulation layer 13 formed by an inorganic thin film, which is configured to electrically isolate the reflecting layer from the reflecting electrode in the manufacturing process. The manufacturing method according to this embodiment can simplify the complexity of the manufacturing process, and increase the yield of the organic light-emitting diode display panels.

In the present disclosure, for the existing problem, the pixel defining layer of the organic light-emitting diode display panel, the organic light-emitting diode display panel, and the manufacturing method thereof are provided. The lateral light emitted from the organic light-emitting diode device layer is reflected by the reflecting layer disposed in the pixel defining layer, such that the waveguide effect of the organic light-emitting diode device can be reduced and the light output efficiency of the organic light-emitting diode device is increased. Therefore, the problem in the prior art is solved and the light emission performance of the organic light-emitting diode device is enhanced.

Apparently, the above embodiments of the present disclosure are illustrated only for clear description of the present disclosure, but are not intended to limit the embodiments of the present disclosure. A person of ordinary skill in the art may also make other different forms of changes or variations according to the above description. All embodiments cannot be exhaustive herein and obvious changes or variations derived from the technical solutions of the present disclosure still fall within the scope of protection of the present disclosure.

What is claimed is:

1. A pixel defining layer of an organic light-emitting diode display panel, comprising:
   an insulating transparent cladding layer; and
   a reflecting layer covered by the transparent cladding layer, wherein the reflecting layer is configured to reflect light emitted from a light-emitting layer of the organic light-emitting diode display panel;
   wherein the reflecting layer is spaced from the light-emitting layer by the transparent cladding layer, such that the reflecting layer is not in contact with the light-emitting layer; and a thickness of the reflecting layer is not less than a thickness of the light-emitting layer in a direction perpendicular to a substrate of the organic light-emitting diode display panel.

2. The pixel defining layer according to claim 1, wherein the thickness of the reflecting layer ranges from 0.5 μm to 1.4 μm, and the thickness of the light-emitting layer is less than 0.4 μm.

3. The pixel defining layer according to claim 1, wherein a side of the reflecting layer proximal to the light-emitting layer surrounded by the reflecting layer is inclined, and an area of a side of the reflecting layer distal from the substrate of the organic light-emitting diode display panel is less than an area of a side of the reflecting layer proximal to the substrate.

4. The pixel defining layer according to claim 3, wherein an angle between the inclined side surface of the reflecting layer and the substrate of the organic light-emitting diode display panel is greater than or equal to 15° and less than or equal to 30°.

5. The pixel defining layer according to claim 3, wherein a reflectivity of the reflecting layer is greater than 90%.

6. The pixel defining layer according to claim 1, wherein the reflecting layer is a metal layer.

7. The pixel defining layer according to claim 6, wherein a material of the metal layer is Ag or Al.

8. The pixel defining layer according to claim 1, wherein the transparent cladding layer is provided with a plurality of grooves, wherein a side of the groove proximal to the light-emitting layer surrounded by the groove is inclined, and an area of a side of the groove distal from the substrate of the organic light-emitting diode display panel is greater than an area of a side of the groove proximal to the substrate.

9. The pixel defining layer according to claim 8, wherein an angle between a side of the groove and the substrate is greater than or equal to 25° and less than or equal to 30°.

10. The pixel defining layer according to claim 8, wherein a transparency of the transparent cladding layer is greater than 90%.

11. An organic light-emitting diode display panel, comprising:
    a substrate;
    a pixel defining layer; and
    a device layer in a groove defined by the pixel defining layer;
    wherein the pixel defining layer comprises:
       an insulating transparent cladding layer; and
       a reflecting layer covered by the transparent cladding layer, wherein the reflecting layer is configured to reflect light emitted from a light-emitting layer of the organic light-emitting diode display panel;
wherein the reflecting layer is spaced from the light-emitting layer by the transparent cladding layer, such that the reflecting layer is not in contact with the light-emitting layer; and a thickness of the reflecting layer is not less than a thickness of the light-emitting layer in a direction perpendicular to a substrate of the organic light-emitting diode display panel.

12. The organic light-emitting diode display panel according to claim 11, wherein the device layer comprises:
a reflecting electrode;
a light-emitting layer on the reflecting electrode; and
a transparent electrode on the light-emitting layer.

13. The organic light-emitting diode display panel according to claim 12, wherein
a material of the reflecting electrode is Ag or an ITO—Ag—ITO alloy; and
a material of the transparent electrode is one of Ag, Al, a Mg—Ag alloy, and a Mg—Al alloy.

14. A method for manufacturing an organic light-emitting diode display panel, wherein the organic light-emitting diode display panel comprises: a substrate, a pixel defining layer, and a device layer in a groove defined by the pixel defining layer; wherein the pixel defining layer comprises: an insulating transparent cladding layer, and a reflecting layer covered by the transparent cladding layer, wherein the reflecting layer is configured to reflect light emitted from a light-emitting layer of the organic light-emitting diode display panel; wherein the reflecting layer is spaced from the light-emitting layer by the transparent cladding layer, such that the reflecting layer is not in contact with the light-emitting layer; and a thickness of the reflecting layer is not less than a thickness of the light-emitting layer in a direction perpendicular to a substrate of the organic light-emitting diode display panel, the method comprises:
forming a pixel defining layer on the substrate; and
forming a device layer in a groove defined by the pixel defining layer.

15. The method according to claim 14, wherein forming the device layer in the groove defined by the pixel defining layer comprises:
forming, before the pixel defining layer is manufactured, a first metal layer on the substrate;
forming the reflecting electrode by patterning the first metal layer; and
forming the device layer by forming the light-emitting layer and the transparent electrode sequentially on the reflecting electrode.

16. The method according to claim 15, wherein forming the pixel defining layer on the substrate comprises:
forming a second metal layer to cover the reflecting electrode and the substrate;
forming the reflecting layer by patterning the second metal layer, wherein the reflecting layer surrounds the exposed reflecting electrode and is electrically isolated from the reflecting electrode;
forming a polyimide layer to cover the reflecting layer and the reflecting electrode; and
forming the transparent cladding layer by patterning the polyimide layer, wherein the pixel defining layer is formed by the transparent cladding layer and the reflecting layer, and the pixel defining layer covers the reflecting electrode and surrounds the exposed reflecting electrode.

17. The method according to claim 16, wherein after forming the reflecting electrode by patterning the first metal layer and before forming the second metal layer to cover the reflecting electrode and the substrate, the method further comprises:
forming an inorganic thin film layer to cover the reflecting electrode and the exposed substrate.

18. The method according to claim 17, wherein forming the second metal layer to cover the reflecting electrode and the substrate and forming the reflecting layer by patterning the second metal layer comprises:
forming the second metal layer to cover the inorganic thin film layer; and
exposing the reflecting electrode by patterning the second metal layer, and forming the reflecting layer on the non-patterned inorganic thin film layer.

* * * * *